(12) United States Patent
Alamouti et al.

(10) Patent No.: US 8,351,545 B2
(45) Date of Patent: **\*Jan. 8, 2013**

(54) LOW COMPLEXITY MAXIMUM LIKELIHOOD DETECTION OF CONCATENATED SPACE CODES FOR WIRELESS APPLICATIONS

(75) Inventors: Siavash Alamouti, Kirkland, WA (US); Patrick Poon, Redmond, WA (US); Vahid Tarokh, Hackensack, NJ (US)

(73) Assignee: AT&T Mobility II LLC, Atlanta, GA (US)

( \* ) Notice: Subject to any disclaimer, the term of this patent is extended or adjusted under 35 U.S.C. 154(b) by 423 days.

This patent is subject to a terminal disclaimer.

(21) Appl. No.: 12/650,007

(22) Filed: Dec. 30, 2009

(65) Prior Publication Data
US 2010/0119006 A1 May 13, 2010

Related U.S. Application Data

(60) Continuation of application No. 11/018,780, filed on Dec. 21, 2004, now Pat. No. 7,643,568, which is a continuation of application No. 10/334,343, filed on Dec. 30, 2002, now Pat. No. 6,853,688, which is a continuation of application No. 10/005,095, filed on Dec. 3, 2001, now Pat. No. 6,807,240, which is a division of application No. 09/167,422, filed on Oct. 5, 1998, now Pat. No. 6,501,803.

(60) Provisional application No. 60/063,794, filed on Oct. 31, 1997.

(51) Int. Cl.
*H04B 7/06* (2006.01)
*H04B 7/10* (2006.01)
*H04L 5/12* (2006.01)
*H04L 1/02* (2006.01)
*H03M 13/03* (2006.01)

(52) U.S. Cl. ........ 375/299; 375/265; 375/267; 375/341; 375/347; 714/792; 714/795

(58) Field of Classification Search ................... 375/265, 375/267, 299, 341, 347; 714/792, 795
See application file for complete search history.

(56) References Cited

U.S. PATENT DOCUMENTS

| | | | |
|---|---|---|---|
| 3,633,107 | A | 1/1972 | Brady |
| 3,978,408 | A | 8/1976 | Gupta et al. |
| 4,001,692 | A | 1/1977 | Fenwick et al. |
| 4,099,121 | A | 7/1978 | Fang |

(Continued)

FOREIGN PATENT DOCUMENTS

CA 2203903 5/1996

(Continued)

OTHER PUBLICATIONS

Alamouti et al., "Trellis-Coded Modulation and Transmit Diversity: Design Criteria and Performance Evaluation," 0-7803-5106-1/98, pp. 703-708, 1998 IEEE.

(Continued)

*Primary Examiner* — Betsy Deppe
(74) *Attorney, Agent, or Firm* — Zagorin O'Brien Graham LLP

(57) ABSTRACT

Good transmission characteristics are achieved in the presence of fading with a transmitter that employs a trellis coder followed by a block coder. Correspondingly, the receiver comprises a Viterbi decoder followed by a block decoder. Advantageously, the block coder and decoder employ time-space diversity coding which, illustratively, employs two transmitter antennas and one receiver antenna.

12 Claims, 1 Drawing Sheet

U.S. PATENT DOCUMENTS

| | | |
|---|---|---|
| 4,281,411 A | 7/1981 | Bonn et al. |
| 4,369,516 A | 1/1983 | Byrns |
| 4,567,464 A | 1/1986 | Siegel |
| 4,577,332 A | 3/1986 | Brenig |
| 4,675,880 A | 6/1987 | Davarian |
| 4,733,402 A | 3/1988 | Monsen |
| 4,763,331 A | 8/1988 | Matsumoto |
| 4,953,183 A | 8/1990 | Bergmans et al. |
| 5,022,053 A | 6/1991 | Chung et al. |
| 5,029,185 A | 7/1991 | Wei |
| 5,088,113 A | 2/1992 | Wei |
| 5,101,501 A | 3/1992 | Gilhousen et al. |
| 5,109,390 A | 4/1992 | Gilhousen et al. |
| 5,127,025 A | 6/1992 | Okanoue |
| 5,170,413 A | 12/1992 | Hess et al. |
| 5,202,903 A | 4/1993 | Okanoue |
| 5,283,780 A | 2/1994 | Schuchman et al. |
| 5,305,353 A | 4/1994 | Weerackody |
| 5,319,677 A | 6/1994 | Kim |
| 5,369,412 A | 11/1994 | Tsujimoto |
| 5,396,518 A | 3/1995 | How |
| 5,416,797 A | 5/1995 | Gilhousen et al. |
| 5,418,798 A | 5/1995 | Wei |
| 5,442,627 A | 8/1995 | Viterbi et al. |
| 5,457,712 A | 10/1995 | Weerackody |
| 5,461,646 A | 10/1995 | Anvari |
| 5,461,696 A | 10/1995 | Frank et al. |
| 5,467,374 A | 11/1995 | Chennakeshu et al. |
| 5,479,448 A | 12/1995 | Seshadri |
| 5,481,572 A | 1/1996 | Skold et al. |
| 5,487,091 A | 1/1996 | Jasper et al. |
| 5,499,272 A | 3/1996 | Bottomley |
| 5,524,125 A | 6/1996 | Tsujimoto |
| 5,553,102 A | 9/1996 | Jasper et al. |
| 5,613,219 A | 3/1997 | Vogel et al. |
| 5,619,533 A | 4/1997 | Dent |
| 5,675,590 A | 10/1997 | Alamouti |
| 5,680,419 A | 10/1997 | Bottomley |
| 5,781,845 A | 7/1998 | Dybdal et al. |
| 5,787,131 A | 7/1998 | Bottomley |
| 5,790,570 A | 8/1998 | Heegard et al. |
| 5,790,598 A | 8/1998 | Moreland et al. |
| 5,819,168 A | 10/1998 | Golden et al. |
| 5,822,380 A | 10/1998 | Bottomley |
| 5,838,728 A | 11/1998 | Alamouti et al. |
| 5,838,742 A | 11/1998 | AbuDayya |
| 5,848,103 A | 12/1998 | Weerackody |
| 5,859,870 A | 1/1999 | Tsujimoto |
| 5,859,879 A | 1/1999 | Bolgiano et al. |
| 5,924,034 A | 7/1999 | Dupuy |
| 5,933,421 A | 8/1999 | Alamouti et al. |
| 5,943,372 A | 8/1999 | Gans et al. |
| 5,949,833 A | 9/1999 | Weerackody |
| 5,960,039 A | 9/1999 | Martin et al. |
| 5,991,273 A | 11/1999 | Abu-Dayya |
| 5,991,331 A | 11/1999 | Chennakeshu et al. |
| 5,999,826 A | 12/1999 | Whinnett |
| 6,031,474 A | 2/2000 | Kay et al. |
| 6,034,987 A | 3/2000 | Chennakeshu et al. |
| 6,038,263 A | 3/2000 | Kotzin et al. |
| 6,038,272 A | 3/2000 | Golden et al. |
| 6,044,120 A | 3/2000 | Bar-David et al. |
| 6,067,324 A | 5/2000 | Harrison |
| 6,081,566 A | 6/2000 | Molnar et al. |
| 6,088,408 A | 7/2000 | Calderbank et al. |
| 6,094,465 A | 7/2000 | Stein et al. |
| 6,097,771 A | 8/2000 | Foschini |
| 6,101,399 A | 8/2000 | Raleigh et al. |
| 6,115,427 A | 9/2000 | Calderbank |
| 6,128,355 A | 10/2000 | Backman et al. |
| 6,137,843 A | 10/2000 | Chennakeshu et al. |
| 6,144,711 A | 11/2000 | Raleigh et al. |
| 6,144,771 A | 11/2000 | Li et al. |
| 6,154,485 A | 11/2000 | Harrison |
| 6,173,005 B1 | 1/2001 | Kotzin et al. |
| 6,178,196 B1 | 1/2001 | Naguib et al. |
| 6,185,258 B1 | 2/2001 | Alamouti et al. |
| 6,185,266 B1 | 2/2001 | Kuchi et al. |
| 6,188,736 B1 | 2/2001 | Lo et al. |
| 6,192,256 B1 | 2/2001 | Whinnett |
| 6,298,082 B1 | 10/2001 | Harrison |
| 6,304,581 B1 | 10/2001 | Chen et al. |
| 6,317,411 B1 | 11/2001 | Whinnett et al. |
| 6,317,466 B1 | 11/2001 | Foschini et al. |
| 6,327,299 B1 | 12/2001 | Meszko |
| 6,333,953 B1 | 12/2001 | Bottomley et al. |
| 6,377,631 B1 | 4/2002 | Raleigh |
| 6,377,812 B1 | 4/2002 | Rashid-Farrokhi et al. |
| 6,393,074 B1 | 5/2002 | Mandyam et al. |
| 6,411,257 B1 | 6/2002 | Sorelius et al. |
| 6,411,612 B1 | 6/2002 | Halford et al. |
| RE37,802 E | 7/2002 | Fattouche et al. |
| 6,430,231 B1 | 8/2002 | Calderbank |
| 6,452,981 B1 | 9/2002 | Raleigh et al. |
| 6,470,043 B1 | 10/2002 | Lo et al. |
| 6,501,803 B1 | 12/2002 | Alamouti et al. |
| 6,542,556 B1 | 4/2003 | Kuchi et al. |
| 6,549,585 B2 | 4/2003 | Naguib et al. |
| 6,728,307 B1 | 4/2004 | Derryberry et al. |
| 6,741,635 B2 | 5/2004 | Lo et al. |
| 6,775,329 B2 | 8/2004 | Alamouti et al. |
| 6,807,240 B2 | 10/2004 | Alamouti et al. |
| 6,853,688 B2 | 2/2005 | Alamouti et al. |
| 6,888,899 B2 | 5/2005 | Raleigh et al. |
| 7,120,200 B2 | 10/2006 | Alamouti et al. |
| 7,145,971 B2 | 12/2006 | Raleigh et al. |
| 7,203,249 B2 | 4/2007 | Raleigh et al. |
| 7,386,077 B2 | 6/2008 | Alamouti et al. |
| 7,587,007 B2 | 9/2009 | Alamouti et al. |
| 7,643,568 B2 | 1/2010 | Alamouti et al. |
| 7,916,806 B2 | 3/2011 | Alamouti et al. |
| 2004/0157646 A1 | 8/2004 | Raleigh et al. |
| 2005/0157810 A1 | 7/2005 | Raleigh et al. |
| 2010/0091906 A1 | 4/2010 | Raleigh et al. |
| 2011/0170635 A1 | 7/2011 | Alamouti et al. |

FOREIGN PATENT DOCUMENTS

| | | |
|---|---|---|
| CA | 2252664 | 11/1997 |
| CA | 2302289 | 3/1998 |
| CA | 2276207 | 2/2003 |
| DE | 29824760 UI | 6/2002 |
| DE | 29824761 UI | 6/2002 |
| DE | 29824762 UI | 6/2002 |
| DE | 29824763 UI | 6/2002 |
| DE | 29824765 U1 | 6/2002 |
| EP | 0392723 A | 10/1990 |
| EP | 0396101 | 11/1990 |
| EP | 0631399 A | 12/1994 |
| EP | 0767546 | 4/1997 |
| EP | 1016228 | 7/2000 |
| GB | 2237706 | 5/1991 |
| GB | 2280575 (A) | 2/1995 |
| GB | 2290010 (A) | 12/1995 |
| GB | 2311445 (A) | 9/1997 |
| JP | 63286027 | 11/1988 |
| WO | WO 91/20142 | 12/1991 |
| WO | WO 95/22214 | 8/1995 |
| WO | WO 97/24849 | 7/1997 |
| WO | WO 97/41670 | 11/1997 |
| WO | WO 98/09385 | 3/1998 |
| WO | WO 99/14871 | 3/1999 |
| WO | WO 99/23766 | 5/1999 |
| WO | WO 00/11806 | 3/2000 |
| WO | WO 00/18056 | 3/2000 |
| WO | WO 00/49780 | 8/2000 |
| WO | WO 00/51265 | 8/2000 |
| WO | WO 01/19013 | 3/2001 |
| WO | WO 01/54305 | 7/2001 |
| WO | WO 01/56218 | 8/2001 |
| WO | WO 01/63826 | 8/2001 |
| WO | WO 01/69814 | 9/2001 |

OTHER PUBLICATIONS

Alamouti, Siavash M., "A Simple Transmit Diversity Technique for Wireless Communications," IEEE Journal on Select Areas in Communications, Oct. 1998, pp. 1451-1458, vol. 16, No. 8, The Institute of Electrical and Electronics Engineers, Inc., New York, N.Y.

Blanco, M.A. & Zdunek, K., "On the Optimization of Simple Switched Diversity Receivers," 1978 IEEE Conference on Communications and Power, Montreal, Canada, pp. 114-117, (1978).

Blanco, M.A. & Zdunek, K., "Performance and Optimization of Switched Diversity Systems for the Detection of Signals with Rayleigh Fading," IEEE Transactions on Communications, Channels, IEEE Transactions on Vehicular Technology, Nov. 1991, pp. 686-693. vol. 40, No. 4, The Institute of Electrical and Electronics Engineers, Inc., New York, N.Y.

Calderbank, A. et al., "Space-Time Codes for Wireless Communications," 1997 IEEE, ISIT 1997, Jun. 29-Jul. 4, pp. 146, Ulm, Germany.

Cavers, James K., "An Analysis of Pilot Symbol Assisted Modulation for Rayleigh Fading Channels," IEEE Transactions on Vehicular Technology, Nov. 1991, pp. 686-693, vol. 40, No. 4, The Institute of Electrical and Electronics Engineers, Inc., New York, NY.

European Search Report and Written Opinion, mailed Mar. 12, 2010 in EP App. No. 06004662.0, 16 pages.

Foschini, G.J. And Gans, M.J., "On Limits of Wireless Communications in a Fading Environment when Using Multiple Antennas," Wireless Personal Communications, 1998, 6:311-335.

Foschini, G.J., "Layered Space-Time Architecture for Wireless Communication in a Fading Environment when Using Multi-Element Antennae", Bell Technical Labs Journal, pp. 41-59, (1996).

Hinderling, J. et al., "CDMA Mobile Station Modem ASIC," IEEE 1992 Custom Integrated Circuits Conference pp. 10.2.1-10.2.5, (1992).

Hiroike et al., "Combined Effects of Phase Sweeping Transmitter Diversity and Channel Coding," IEEE Transactions on Vehicular Technology, vol. 41, No. 2, May 1992, The Institute of Electrical and Electronics Engineers, Inc., New York, N.Y.

Kerr, R. et al., "The CDMA Digital Cellular System: an ASIC Overview," IEEE 1992 Custom Integrated Circuits Conference pp. 10.1.1-10.1.7, (1992).

Naguib, A. F. et al., "Space-Time Coded Modulation for High Data Rate Wireless Communications," 1997 IEEE, pp. 102-109, 0-7803-4198-8/97, The Institute of Electrical and Electronics Engineers, Inc., New York, N.Y.

Naguib, Ayman et al., "A Space-Time Coding Modem for High-Data-Rate Wireless Communications," IEEE Journal on Selected Areas in Communications, Oct. 1998, pp. 1459-1478, The Institute of Electrical and Electronics Engineers, Inc., New York, N.Y.

Non-Final Office Action mailed Nov. 21, 2008 in U.S. Appl. No. 11/929,090, 14 pages.

Non-Final Office Action mailed Jun. 1, 2010 in U.S. Appl. No. 11/828,790, 11 pages.

Pickholtz, R.L. et al., "Theory of Spread Spectrum Communications—A Tutorial," IEEE Transactions on Communications, 30(5):855-884, (1982).

Sampei, S. et al., "Rayleigh Fading Compensation Method for 16QAM in Digital Land Mobile Radio Channels," Proceeding of the 1989 IEEE Vehicular Technology Conference, May 1989, pp. 640-646, The Institute of Electrical and Electronics Engineers, Inc., New York, N.Y.

Seshadri, N. et al., "Advanced Techniques for Modulation, Error Correction, Channel Equalization and Diversity," AT&T Tech. Journal 47(4): 48-63, Jul. 1993.

Seshadri, N. et al., "Space-Time Codes for Wireless Communication: Code Construction," IEEE 47th Vehicular Technology Conf., Phoenix, pp. 637-641, May 1997.

Seshadri, N. et al., "Two Signaling Schemes for Improving the Error Performance of FDD Transmission Systems Using Transmitter Antenna Diversity," Proceeding of the 1993 IEEE Vehicular Technology Conference (VTC 43.sup.rd), May 1993, pp. 508-511, The Institute of Electrical and Electronics Engineers, Inc., New York, N.Y.

Tarokh, V. et al., "Space Time Codes for High Data Rate Wireless Communication: Performance Criteria in the Presence of Channel Estimation Errors, Mobility, and Multiple Paths", IEEE Transactions on Communications 47(2):199-207, (1999).

Tarokh, V., et al. "Space-Time Codes for High Data Rate Wireless Communication: Performance Criteria," IEEE International Conference on Communications, Montreal, 1:299-303, Jun. 1997.

Tarokh, Vahid et al., "Combined Array Processing and Space-Time Coding," IEEE Transactions on Information Theory, May 1999, pp. 1121-1128, vol. 45, No. 4, The Institute of Electrical and Electronics Engineers, Inc., New York, N.Y.

Tarokh, Vahid et al., "Space-Time Codes for High Data Rate Wireless Communication: Performance Criterion and Code Construction," IEEE Transactions on Information Theory, Mar. 1998, pp. 744-765, vol. 44, No. 2, The Institute of Electrical and Electronics Engineers, Inc., New York, N.Y.

Ungerboeck, G., "Channel Coding with Multilevel/Phase Signals," IEEE Transactions on Information Theory, Jan. 1982, pp. 56-67, vol. IT-28, No. 1, The Institute of Electrical and Electronics Engineers, Inc., New York, N.Y.

Weerackody, V., "Diversity for the Direct-Sequence Spread Spectrum System Using Multiple Transmit Antennas," Proceedings of the IEEE International Conference on Communications, May 23-26, 1993, Geneva, vol. 3, pp. 1775-1779.

Winters, J.H., "The Diversity Gain of Transmit Diversity in Wireless Systems with Rayleigh Fading," Proceeding of the 1994 ICC/SUPERCOMM, New Orleans, May 1994, vol. 2, pp. 1121-1125, The Institute of Electrical and Electronics Engineers, Inc., New York, N.Y.

Winters, J.H., Salz, J., Gitlin, R.D., "The Impact of Antenna Diversity on the Capacity of Wireless Communications Systems," IEEE Transactions on Communications, vol. 42, No. 2, Feb./Mar./Apr. 1994, pp. 1740-1751, IEEE Communications Society, New York, N.Y.

Wittneben, A. "A New Bandwidth Efficient Transmit Antenna Modulation Diversity Scheme for Linear Digital Modulation," Proceeding of the 1993 IEEE International Conference on Communications (IICC '93), May 1993, pp. 1630-1634, The Institute of Electrical and Electronics Engineers, Inc., New York, N.Y.

Wittneben, A. "Basestation modulation diversity for digital SIMULCAST," Proceeding of the 1991 IEEE Vehicular Technology Conference, May 1991, pp. 848-853, The Institute of Electrical and Electronics Engineers, Inc., New York, N.Y.

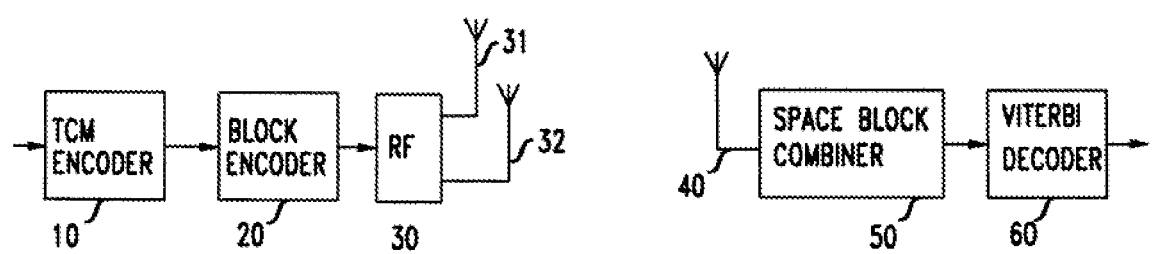

LOW COMPLEXITY MAXIMUM LIKELIHOOD DETECTION OF CONCATENATED SPACE CODES FOR WIRELESS APPLICATIONS

CROSS-REFERENCE TO RELATED APPLICATION(S)

This application is a continuation of U.S. patent application Ser. No. 11/018,780, filed Dec. 21, 2004, which is a continuation of U.S. patent application Ser. No. 10/334,343, filed Dec. 30, 2002 (now U.S. Pat. No. 6,853,688), which is a continuation of U.S. patent application Ser. No. 10/005,095, filed Dec. 3, 2001 (now U.S. Pat. No. 6,807,240), which is a divisional of U.S. patent application Ser. No. 09/167,422, filed Oct. 5, 1998 (now U.S. Pat. No. 6,501,803), which claims the benefit of U.S. Provisional Application No. 60/063,794, filed Oct. 31, 1997, all of which are incorporated herein by reference in their entirety.

BACKGROUND OF THE INVENTION

This invention relates to wireless communication and, more particularly, to techniques for effective wireless communication in the presence of fading and other degradations.

The most effective technique for mitigating multipath fading in a wireless radio channel is to cancel the effect of fading at the transmitter by controlling the transmitter's power. That is, if the channel conditions are known at the transmitter (on one side of the link), then the transmitter can pre-distort the signal to overcome the effect of the channel at the receiver (on the other side). However, there are two fundamental problems with this approach. The first problem is the transmitter's dynamic range. For the transmitter to overcome an x dB fade, it must increase its power by x dB which, in most cases, is not practical because of radiation power limitations, and the size and cost of amplifiers. The second problem is that the transmitter does not have any knowledge of the channel as seen by the receiver (except for time division duplex systems, where the transmitter receives power from a known other transmitter over the same channel). Therefore, if one wants to control a transmitter based on channel characteristics, channel information has to be sent from the receiver to the transmitter, which results in throughput degradation and added complexity to both the transmitter and the receiver.

Other effective techniques are time and frequency diversity. Using time interleaving together with coding can provide diversity improvement. The same holds for frequency hopping and spread spectrum. However, time interleaving results in unnecessarily large delays when the channel is slowly varying. Equivalently, frequency diversity techniques are ineffective when the coherence bandwidth of the channel is large (small delay spread).

It is well known that in most scattering environments antenna diversity is the most practical and effective technique for reducing the effect of multipath fading. The classical approach to antenna diversity is to use multiple antennas at the receiver and perform combining (or selection) to improve the quality of the received signal.

The major problem with using the receiver diversity approach in current wireless communication systems, such as IS-136 and GSM, is the cost, size and power consumption constraints of the receivers. For obvious reasons, small size, weight and cost are paramount. The addition of multiple antennas and RF chains (or selection and switching circuits) in receivers is presently not be feasible. As a result, diversity techniques have often been applied only to improve the up-link (receiver to base) transmission quality with multiple antennas (and receivers) at the base station. Since a base station often serves thousands of receivers, it is more economical to add equipment to base stations rather than the receivers Recently, some interesting approaches for transmitter diversity have been suggested. A delay diversity scheme was proposed by A. Wittneben in "Base Station Modulation Diversity for Digital SIMULCAST," Proceeding of the 1991 IEEE Vehicular Technology Conference (VTC 41st), PP. 848-853, May 1991, and in "A New Bandwidth Efficient Transmit Antenna Modulation Diversity Scheme For Linear Digital Modulation," in Proceeding of the 1993 IEEE International Conference on Communications (IICC '93), PP. 1630-1634, May 1993. The proposal is for a base station to transmit a sequence of symbols through one antenna, and the same sequence of symbols—but delayed—through another antenna.

U.S. Pat. No. 5,479,448, issued to Nambirajan Seshadri on Dec. 26, 1995, discloses a similar arrangement where a sequence of codes is transmitted through two antennas. The sequence of codes is routed through a cycling switch that directs each code to the various antennas, in succession. Since copies of the same symbol are transmitted through multiple antennas at different times, both space and time diversity are achieved. A maximum likelihood sequence estimator (MLSE) or a minimum mean squared error (MMSE) equalizer is then used to resolve multipath distortion and provide diversity gain. See also N. Seshadri, J. H. Winters, "Two Signaling Schemes for Improving the Error Performance of FDD Transmission Systems Using Transmitter Antenna Diversity," Proceeding of the 1993 IEEE Vehicular Technology Conference (VTC 43rd), pp. 508-511, May 1993; and J. H. Winters, "The Diversity Gain of Transmit Diversity in Wireless Systems with Rayleigh Fading," Proceeding of the 1994 ICC/SUPERCOMM, New Orleans, Vol. 2, PP, 1121-1125, May 1994.

Still another interesting approach is disclosed by Tarokh, Seshadri, Calderbank and Naguib in U.S. application, Ser. No. 08/847,635, filed Apr. 25, 1997 (based on a provisional application filed Nov. 7, 1996), where symbols are encoded according to the antennas through which they are simultaneously transmitted, and are decoded using a maximum likelihood decoder. More specifically, the process at the transmitter handles the information in blocks of M1 bits, where M1 is a multiple of M2, i.e., M1=k*M2. It converts each successive group of M2 bits into information symbols (generating thereby k information symbols), encodes each sequence of k information symbols into n channel codes (developing thereby a group of n channel codes for each sequence of k information symbols), and applies each code of a group of codes to a different antenna.

Yet another approach is disclosed by Alamouti and Tarokh in U.S. application Ser. No. 09/074,224, filed May 5, 1998, and titled "Transmitter Diversity Technique for Wireless Communications" where symbols are encoded using only negations and conjugations, and transmitted in a manner that employs channel diversity.

Still another approach is disclosed by the last-mentioned inventors in a US application filed Jul. 14, 1998, based on provisional application 60/052,689 filed Jul. 17, 1997, titled "Combined Array Processing and Space-Time Coding" where symbols are divided into groups, where each group is transmitted over a separate group of antennas and is encoded with a group code C that is a member of a product code.

SUMMARY

An advance in the art is realized with a transmitter that employs a trellis coder followed by a block coder. Correspondingly, the receiver comprises a Viterbi decoder followed by a block decoder. Advantageously, the block coder and decoder employ time-space diversity coding which, illustratively, employs two transmitter antennas and one receiver antenna.

BRIEF DESCRIPTION OF THE DRAWINGS

FIG. 1 presents a block diagram of an embodiment in conformance with the principles of this invention.

DETAILED DESCRIPTION

FIG. 1 presents a block diagram of an arrangement comporting with the principles of this invention. It comprises a trellis code modulation (TCM) encoder 10 followed by a two-branch space block encoder 20. The output is applied to antenna circuitry 30, which feeds antenna 31, and antenna 32. FIG. 1 shows only two antennas, but this is merely to illustrative. Arrangements can be had with a larger number of antennas, and it should be understood that the principles disclosed herein apply with equal advantage to such arrangements.

TCM encoder 10 generates complex numbers that represent constellation symbols, and block encoder 20 encodes (adjacent) pairs of symbols in the manner described in the aforementioned Ser. No. 09/074,224 application. That is, symbols $s_0$ and $s_1$, forming a pair, are sent to antenna 31 and antenna 32, respectively, and in the following time period symbols—$s_1^*$ and $s_0^*$ are sent to antennas 31 and 32, respectively. Thereafter, symbols $s_2$ and $s_3$ are sent to antenna 31 and 32, respectively, etc. Thus, encoder 20 creates channel diversity that results from signals traversing from the transmitter to the receiver at different times and over different channels.

The signals transmitted by antennas 31 and 32 are received by a receiver after traversing the airlink and suffering a multiplicative distortion and additive noise. Hence, the received signals at the two consecutive time intervals during which the signals $s_0$, $S_1$, $-s_1^*$, and $s_0^*$ are sent correspond to:

$$r_0(t)=h_0 s_0+h_1 s_1+n_0, \quad (1)$$

$$\text{and } r_1(t)=h_1 s_0^*-h_0 s_1^*+n_1, \quad (2)$$

where $h_0$ represents the channel from antenna 31, $h_1$ represents the channel from antenna 32, $n_0$ is the received noise at the first time interval, and $n_1$ is the received noise at the second time interval.

The receiver comprises a receive antenna 40, a two-branch space block combiner 50, and a Viterbi decoder 60. The receiver also includes a channel estimator; but since that is perfectly conventional and does not form a part of the invention, FIG. 1 does not explicitly show it. The following assumes that the receiver possesses $\tilde{h}_0$ and $\tilde{h}_1$, which are estimates of $h_0$ and $h_1$, respectively. Thus, the received signals at the first and second time intervals are combined in element 50 to form signals $$\tilde{s}_0=\tilde{h}_0^* r_0^* + \tilde{h}_1 r_1^* \quad (3)$$

$$\text{and } \tilde{s}_1=\tilde{h}_1^* r_0 - \tilde{h}_0 r_1^*, \quad (4)$$

and those signals are applied to Viterbi decoder 60.

The Viterbi decoder builds the following metric for the hypothesized branch symbol $s_i$ corresponding to the first transmitted symbol $s_0$:

$$M(s_0,s_i)=d^2[\tilde{s}_0,(|\tilde{h}_0|^2+|\tilde{h}_1|^2)s_i]. \quad (5)$$

Similarly, the Viterbi decoder builds the following metric for the hypothesized branch symbol $s_i$ corresponding to the first transmitted symbol $s_1$:

$$M(s_1,s_i)=d^2[\tilde{s}_1,(|\tilde{h}_0|^2+|\tilde{h}_1|^2)s_i]. \quad (6)$$

(Additional metrics are similarly constructed in arrangements that employ a larger number of antennas and a correspondingly larger constellation of signals transmitted at any one time.) If Trellis encoder 10 is a multiple TCM encoder, then the Viterbi decoder builds the following metric:

$$M[(s_0,s_1),(s_i,s_j)]=M(s_0,s_i)+M(s_1,s_j). \quad (7)$$

or equivalently, $$M[(s_0,s_1),(s_i,s_j)]=d^2(r_0,\tilde{h}_0 s_i+\tilde{h}_1 s_j)+d^2(r_1,\tilde{h}_1 s_i^*-\tilde{h}_0 s_j^*). \quad (8)$$

The Viterbi decoder outputs estimates of the transmitted sequence of signals.

The above presented an illustrative embodiment. However, it should be understood that various modifications and alternations might be made by a skilled artisan without departing from the spirit and scope of this invention.

What is claimed is:

1. An apparatus comprising:
   a trellis encoder, wherein the trellis encoder generates a first symbol and a second symbol; and
   a block encoder responsive to the trellis encoder and adapted to feed a plurality of antennas, wherein the block encoder generates a block including the first symbol, the second symbol, a third symbol generated using a negative complex conjugation of the second symbol, and a fourth symbol generated using a complex conjugation of the first symbol.

2. The apparatus as recited in claim 1 further comprising the plurality of antennas.

3. In a transmitter, a method for linking trellis codes with block codes, the method comprising:
   trellis encoding received data to generate a first symbol and a second symbol;
   block encoding the first and second symbols to generate a block of symbols that includes the first and second symbols, the block encoding including generating a third symbol for the block of symbols using a negative complex conjugation of the second symbol, and generating a fourth symbol for the block of symbols using a complex conjugation of the first symbol; and
   supplying the block of symbols for transmission over a plurality of antennas.

4. The method as recited in claim 3 wherein the plurality of antennas comprises a first and a second antenna.

5. The method as recited in claim 3 further comprising transmitting the block of symbols over the first and the second antenna by transmitting the first and second symbols over the first and second antennas, respectively, during a first time period, and transmitting the third and fourth symbols over the first and second antennas, respectively, during a second time period.

6. A receiver comprising:
   a receive antenna;
   a space block combiner configured to combine signals transmitted from at least a first and a second transmit antenna and received at the receive antenna at a first and second time interval, the received signals including a first signal received at the first time interval, the first signal including a first symbol and a second symbol transmitted from the first and second transmit antennas, respectively, and the received signals including a second signal received at the second time interval, the second signal including a negative complex conjugate of the second symbol and a complex conjugate of the first symbol, transmitted from the first and second transmit antennas, respectively; and a Viterbi decoder responsive to output signals of the space block combiner to output estimates of transmitted symbols.

7. The receiver as recited in claim 6 wherein the space block combiner combines a frame of received symbols, wherein the frame comprises m symbols received over each of the first and second time intervals.

8. The receiver as recited in claim 7 wherein m=2.

9. The receiver as recited in claim 6 wherein received signals $r_0$ and $r_1$ received over the first and second time intervals by the receive antenna, respectively, are $r_0(t)=h_0s_0+h_1s_1+n_0$ and $r_1(t)=h_1s_0*-h_0s_1*+n_1$, where $h_0$ represents characteristics of a first channel from a first transmit antenna to the receive antenna, $h_1$ represents characteristics of a second channel from a second transmit antenna to the receive antenna, $n_0$ is the received noise at the first time interval, and $n_1$ is the received noise at the second time interval, $s_0$ and $s_1$ are the first and second symbols respectively transmitted from the first and second transmit antennas and $-s_1*$ and $s_o*$ are the negative complex conjugate and the complex conjugate respectively transmitted from the first and second transmit antennas.

10. The receiver as recited in claim 9 wherein the combiner generates signals $\tilde{s}_0=\tilde{h}_0*r_0+\tilde{h}_1r_1*$ and $\tilde{s}_1=\tilde{h}_1*r_0-\tilde{h}_0r_1*$, where $\tilde{h}_0$ and $\tilde{h}_1$ are estimates of $h_0$ and $h_1$, respectively.

11. The receiver as recited in claim 9 wherein the Viterbi decoder develops a metric $M(s_0,s_i)=d^2[\tilde{s}_0,(|\tilde{h}_0|^2+|\tilde{h}_1|^2)s_i]$ for the hypothesized branch symbol $s_i$ corresponding to the symbol $s_0$, where $\tilde{h}_0$ $\tilde{h}_1$ are estimates of $h_0$ and $h_1$, respectively and $d^2$ represents the squared Euclidean distance.

12. The receiver as recited in claim 6 wherein the Viterbi decoder builds a metric $M[(s_0,s_1),(s_i,s_j)]=d^2(r_0,\tilde{h}_0s_i+\tilde{h}_1s_j)+d^2(r_1\tilde{h}_1s_i*-\tilde{h}_0s_j*)$, wherein $s_i$ is a hypothesized signal at the first time interval, $S_j$ is a hypothesized signal at the second time interval, $s_0$ is a transmitted symbol at the first time interval, $s_j$ is a transmitted symbol at the second time interval, where $\tilde{h}_0$ is an estimate of channel characteristics between the first transmit antenna that transmits symbol $s_0$ and the receive antenna, and $\tilde{h}_1$ is an estimate of channel characteristics between the second transmit antenna that transmits symbol $s_1$ and the receive antenna, where $d^2$ represents the squared Euclidean distance, $r_0$ is the signal received at the first time interval and $r_1$ is the signal received at the second time interval.

* * * * *